United States Patent [19]

Sichanugrist et al.

[11] Patent Number: 5,366,713
[45] Date of Patent: Nov. 22, 1994

[54] METHOD OF FORMING P-TYPE SILICON CARBIDE

[75] Inventors: Porponth Sichanugrist, Kanagawa; Tetsuro Nii; Takahisa Kase, both of Tokyo, all of Japan

[73] Assignee: Showa Shell Sekiyu K.K., Tokyo, Japan

[21] Appl. No.: 68,186

[22] Filed: May 28, 1993

[30] Foreign Application Priority Data

Jun. 3, 1992 [JP] Japan .................. 4-142661

[51] Int. Cl.⁵ .......................................... C01B 31/36
[52] U.S. Cl. .................. 423/346; 423/345; 437/100
[58] Field of Search .......... 423/345, 346; 437/100; 148/DIG. 148

[56] References Cited

U.S. PATENT DOCUMENTS

| | | |
|---|---|---|
| 3,382,113 | 5/1968 | Ebert et al. .................. 437/100 |
| 4,133,689 | 1/1979 | Stroke .......................... 423/346 |
| 4,755,483 | 7/1988 | Haku et al. ................... 437/100 |
| 4,775,425 | 10/1988 | Guha et al. ................... 136/249 |
| 4,847,215 | 7/1989 | Hanaki et al. ................ 437/100 |
| 4,891,330 | 1/1990 | Guha et al. ................... 437/81 |
| 5,021,103 | 6/1991 | Hamakawa et al. ....... 148/DIG. 148 |
| 5,061,322 | 10/1991 | Asano ........................... 437/100 |
| 5,206,180 | 4/1993 | Yoshida ........................ 437/100 |

FOREIGN PATENT DOCUMENTS

| | | | |
|---|---|---|---|
| 61-91361 | 5/1986 | Japan .................. | 423/345 |
| 62-154621 | 7/1987 | Japan .................. | 423/346 |

OTHER PUBLICATIONS

Technical Digest of International PVSEC-3, Nov. 1987.
Patent Abstracts of Japan, vol. 7, No. 205 (C-185)(1350) 9 Sep. 1983 & JP-A-58-104013.
Chemical Abstracts, vol. 99, No. 16, 1983, Columbus, Ohio, US; abstract no. 132341r, 'Amorphous silicon carbide film doped with boron for electronic devices'.
Patent Abstracts of Japan, vol. 16, No. 322 (E-1233) 14 Jul. 1992 & JP-A-40-94172.

*Primary Examiner*—Michael Lewis
*Assistant Examiner*—N. M. Nguyen
*Attorney, Agent, or Firm*—Sughrue, Mion, Zinn, Macpeak & Seas

[57] ABSTRACT

A method of forming p-type silicon carbide which comprises using reactive source gases comprising silane, hydrogen, trimethylboron, and either diborane or boron trifluoride, to thereby attain a widened band gap by the action of the carbon contained in the trimethylboron.

8 Claims, 1 Drawing Sheet

METHOD OF FORMING P-TYPE SILICON CARBIDE

FIELD OF THE INVENTION

The present invention relates to a method of forming p-type silicon carbide having a low resistivity and a high band gap and suited for use in solar cells, optical sensors, and the like.

BACKGROUND OF THE INVENTION

A well known structure of amorphous silicon (a-Si) solar cells having a p-i-n junction is one employing amorphous silicon carbide (a-SiC) as the p-layer. In general, p-type a-SiC is obtained by the glow discharge decomposition of a mixed gas comprising silane gas ($SiH_4$), methane gas ($CH_4$), hydrogen ($H_2$), and diborane gas ($B_2H_6$). Recently, p-type silicon carbide (SiC) having a low resistivity and a wide optical forbidden band width or optical band gap (hereinafter referred to as $E_{opt}$) has been developed as described in, for example, *Technical Digest of the International PVSEC-3*, 1987, pp. 49-52 and JP-A-64-42120. (The term "JP-A" as used herein means an unexamined published Japanese patent application.)

The method described in the former reference uses a hydrogen dilution ratio of 70 times or higher and a high-frequency power density as high as 260 $mW/cm^2$ to form p-type SiC having an $E_{opt}$ of about 2.2 eV and an electric conductivity of about $1 \times 10^{-2}$ $(\Omega.cm)^{-1}$. The method of the latter reference uses a hydrogen dilution ratio as high as about 500 times and a high-frequency power density as high as from 300 $mW/cm^2$ to 1.5 $W/cm^2$ to form p-type SiC having an $E_{opt}$ of about 2.1 eV and an electric conductivity of about $1 \times 10^\circ$ $(\Omega.cm)^{-1}$.

However, the aforementioned methods for p-type SiC production, which employ $CH_4$ as a carbon source, are disadvantageous in that they necessitate a high hydrogen dilution ratio and a high power density as described above since the addition of a large proportion of $CH_4$ causes an abrupt decrease in electric conductivity and impairs film quality. In order to heighten the efficiency of solar cells, it is necessary to develop p-type SiC having a still higher $E_{opt}$ and a high electric conductivity. For use in larger-area solar cells, the SiC is required to be produced using a lower high-frequency power and have a lower resistivity even in a thin film form because the p-layer thickness is as small as 100 to 200 Å.

SUMMARY OF THE INVENTION

An object of the present invention is to provide a method of forming a thin film of p-type silicon carbide having a low resistivity and high band gap using a low high-frequency power.

The above object is accomplished with a method of forming p-type SiC which comprises using reactive source gases comprising silane, hydrogen and suitable amounts of trimethylboron as a carbon source and either diborane or boron trifluoride as a dopant gas. It is preferred that the flow ratio (sccm/sccm) of trimethylboron/silane be from 0.003 to 0.006, more preferably from 0.004 to 0.005, the flow ratio (sccm/sccm) of diborane/silane be from 0.003 to 0.015, more preferably from 0.003 to 0.004, and the flow ratio (sccm/sccm) of boron trifluoride/silane be from 0.003 to 0.015, more preferably from 0.004 to 0.005. Further, it is preferred that argon gas be added to the reactive gases in a suitable amount (for example, from 1 to 50 sccm) in order to attain a low resistivity even when the film thickness is small.

By the addition of a suitable amount of trimethylboron gas ($B(CH_3)_3$) (hereinafter abbreviated as TMB as a carbon source to the reactive gases for forming p-type a-SiC, it is possible to increase the $E_{opt}$ by about 0.1 eV using a low high-frequency power, without decreasing electric conductivity. Preferably, the $E_{opt}$ is from about 1.9 to about 2.26 eV while maintaining the electric conductivity of at least about $1 \times 10^{-1}$ S/cm. Although the $E_{opt}$ varies because of a change in hydrogen content due to changing diborane or boron trifluoride amount, the carbon content in the film does not vary. Therefore, when the TMB/$SiH_4$ ratio is kept constant, the variation range of the $E_{opt}$ is about 0.1 eV at any dopant proportion.

Furthermore, by adding a suitable amount of argon gas to the reactive gases, it is possible to obtain a film which has good uniformity and a low resistivity even when having a reduced thickness.

DESCRIPTION OF PREFERRED EMBODIMENTS

The present invention will be explained below in more detail with reference to the following examples, but the invention is not construed as being limited thereto.

In both Examples 1 and 2 given below, p-type SiC was produced by the following method. A p-type SiC film about 2,000 to 3,000 Å thick was formed by the plasma CVD method on a transparent electrode formed on a 7059-glass substrate manufactured by Corning Ltd. As the reactive gases, use was made of silane gas ($SiH_4$), hydrogen gas ($H_2$), trimethylboron ($B(CH_3)_3$), and either diborane gas ($B_2H_6$) or boron trifluoride ($BF_3$). Representative film-forming conditions are given in Table 1.

TABLE 1

| | | |
|---|---|---|
| Substrate temperature | 200 | °C. |
| Pressure | 1.4 | Torr |
| Power density | about 156 | $mW/cm^2$ |
| $SiH_4$ gas flow | 2 | sccm |
| $H_2$ gas flow | 370 | sccm |
| $B_2H_6$ gas flow | 0–0.03 | sccm |
| $B(CH_3)_3$ gas flow | 0–0.036 | sccm |

EXAMPLE 1

Figure 1:
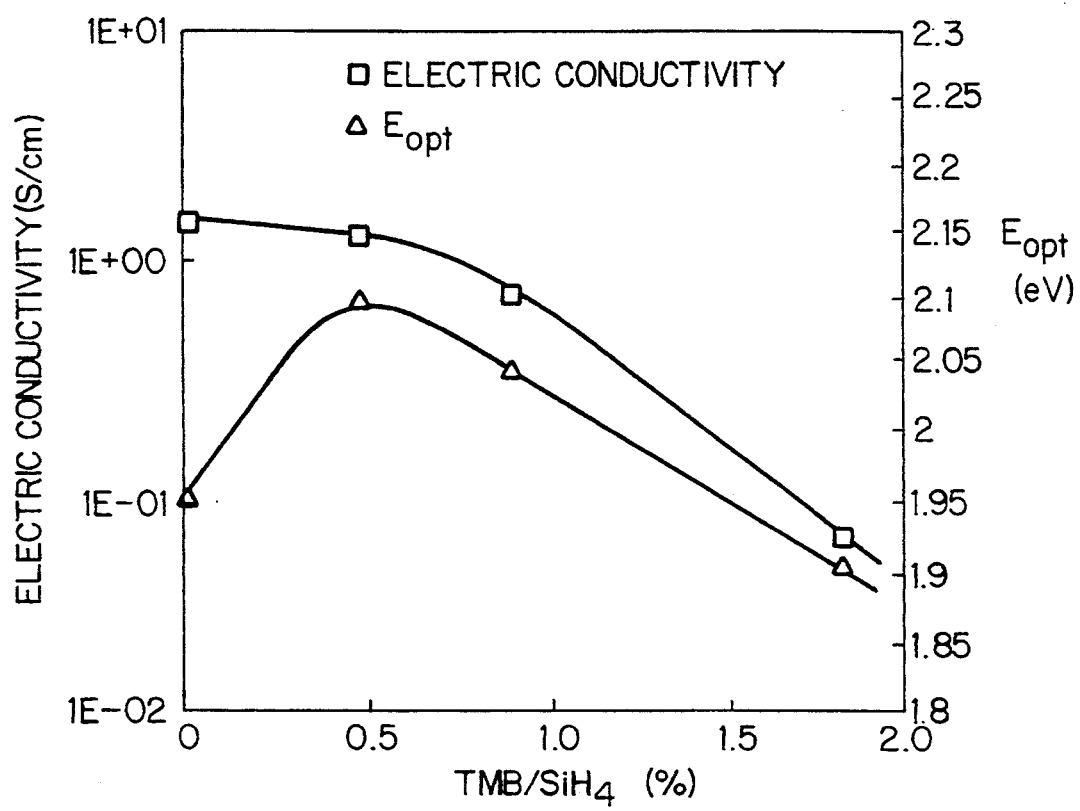
FIG. 1 is a graph showing changes of the electric conductivity and $E_{opt}$ Of p-type SiC with changing $B(CH_3)_3$ flow rate in Example 1.

In FIG. 1 are shown changes of the $E_{opt}$ and electric conductivity of p-type SiC with changing flow rate for $B(CH_3)_3$ added to a mixed gas consisting of $SiH_4$ (2 sccm), $B_2H_6$ (0.01 sccm), and $H_2$ (370 sccm). As apparent from FIG. 1, the $E_{opt}$, which was about 1.97 eV when $B(CH_3)_3$ was not added, tended to increase as the $B(CH_3)_3$ flow rate was increased. When the $B(CH_3)_3/SiH_4$ ratio was increased to 0.0045, the $E_{opt}$ reached about 2.09 eV, that is, it increased by about 0.1 eV from the value for nonuse of B(CH$_3$)$_3$ while maintaining the electric conductivity. As the B(CH$_3$)$_3$ proportion was increased further, the electric conductivity and E$_{opt}$ both decreased. The above results indicate that the optimum B(CH$_3$)$_3$/SiH$_4$ ratio was about 0.0045.

EXAMPLE 2

Figure 2:
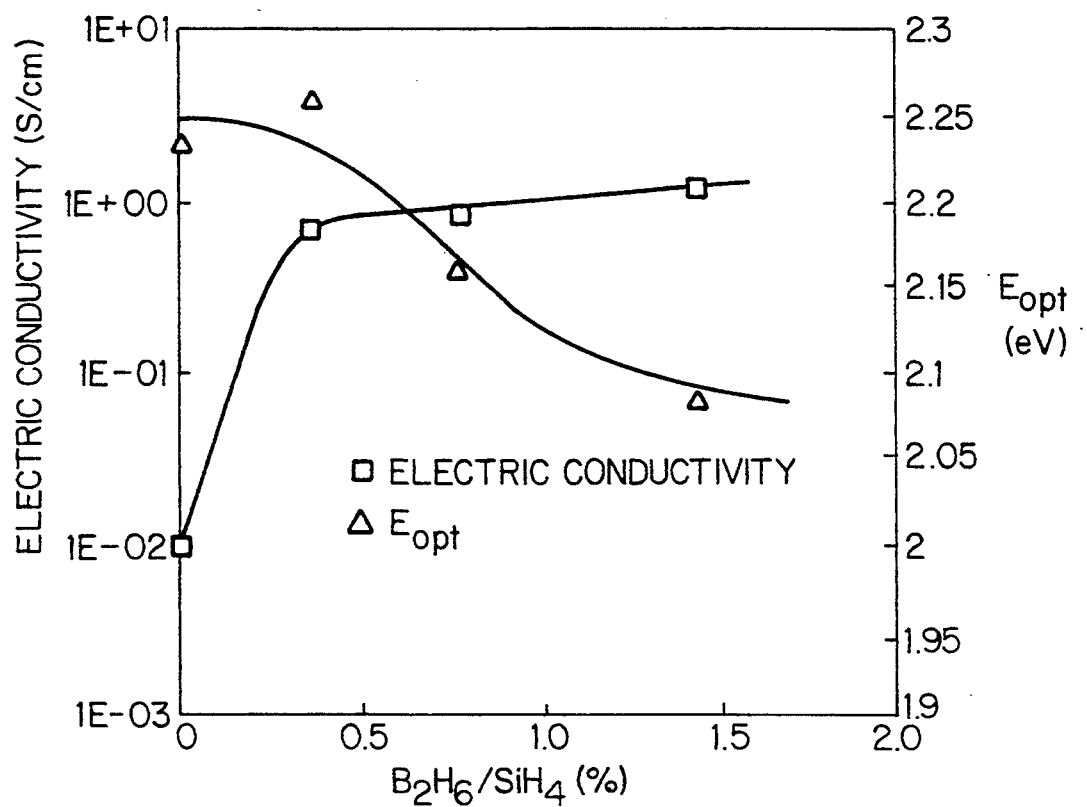
FIG. 2 is a graph showing changes of the electric conductivity and $E_{opt}$ of p-type SiC with changing $B_2H_6$ flow rate in Example 2.

In FIG. 2 are shown changes of E$_{opt}$ and electric conductivity with changing B$_2$H$_6$ flow rate at a TMB/SiH$_4$ ratio of 0.0045. When the B$_2$H$_6$ flow rate was increased from 0 to around a B$_2$H$_6$/SiH$_4$ ratio of 0.00375, the E$_{opt}$ stayed almost constant at about 2.26 eV. However, as the B$_2$H$_6$ flow rate was increased further, the E$_{opt}$ decreased monotonously and, when B$_2$H$_6$/SiH$_4$ ratios were more than 0.015, E$_{opt}$ values required for maintaining high quality were unable to be obtained. On the other hand, the electric conductivity decreased abruptly as the B$_2$H$_6$/SiH$_4$ ratio was reduced beyond about 0.00375. When B$_2$H$_6$ was not added, the electric conductivity was extremely low.

The electric conductivity changed little even when the B$_2$H$_6$/SiH$_4$ flow ratio was increased beyond 0.00375. The above results indicate that B$_2$H$_6$ is necessary for attaining a lower electric conductivity. Thus, low-resistivity, high-band-gap, p-type SiC was obtained which had an E$_{opt}$ of 2.26 eV and an electric conductivity of about $7.0 \times 10^{-1}$ ($\Omega$.cm)$^{-1}$. This SiC is superior to the aforementioned, conventional, low-resistivity, high-band-gap, p-type SiC films formed from CH$_4$-containing source gases. Similar results were obtained when BF$_3$ was used in place of B$_2$H$_6$.

COMPARATIVE EXAMPLE

For purposes of comparison, an experiment was conducted under the same production conditions as those of Table 1 except that CH4, which had conventionally been used frequently, was added in a slight amount in place of B(CH$_3$)$_3$. As a result, when the CH$_4$/SiH$_4$ ratio was 0.25, the E$_{opt}$ increased to about 2.23 eV but the electric conductivity abruptly dropped to $6.5 \times 10^{-8}$ ($\Omega$.cm)$^{-1}$.

It may be difficult to obtain a finely crystallized, low-resistivity film due to the lower power density used in the present Examples as compared with those used in the conventional methods.

EXAMPLE 3

This example deals with the electric conductivity of thin films since it is an important consideration when the thin films of a-SiC are to be used as the p-layers of solar cells.

Films of a-SiC having a thickness of 200 Å were formed under the conditions shown in Table 2 to examine the effect of argon gas addition on electric conductivity. In this examination, the optimum B$_2$H$_6$/SiH$_4$ and B(CH$_3$)$_3$/SiH$_4$ values were used.

TABLE 2

| | | |
|---|---|---|
| Substrate temperature | 200 | °C. |
| Pressure | 1.4 | Torr |
| Power density | about 156 | mW/cm$^2$ |
| SiH$_4$ gas flow | 2 | sccm |
| H$_2$ gas flow | 370 | sccm |
| B$_2$H$_6$ gas flow | 0.0075 | sccm |
| B(CH$_3$)$_3$ gas flow | 0.009 | sccm |
| Argon gas flow | 0-50 | sccm |

Table 3 shows a difference in electric conductivity between films obtained using argon gas at a flow rate of 50 sccm and films obtained without adding argon gas, respectively, under conditions of a B$_2$H$_6$ flow rate of 0.0075 sccm and a B(CH$_3$)$_3$ flow rate of 0.009 sccm. The film obtained using argon showed a significantly improved electric conductivity, which was higher than that of the other by about three orders of magnitude. However, if argon gas was fed at a higher flow rate than 50 sccm, the film obtained had poor uniformity, which indicated that there is an optimum flow rate value for argon gas.

TABLE 3

| Argon Gas | Electrical Conductivity ($\Omega \cdot$ cm)$^{-1}$ |
|---|---|
| not added | $9.2 \times 10^{-7}$ |
| 50 sccm | $3.5 \times 10^{-3}$ |

As described above, in the formation of p-type a-SiC according to the present invention, the E$_{opt}$ can be widened by about 0.1 eV using a low high-frequency power density without decreasing the electric conductivity, by adding a suitable amount of B(CH$_3$)$_3$ as a carbon source to reactive source gases for the p-type a-SiC. As a result, it has become possible to form low-resistivity, high-band-gap, p-type SiC having an E$_{opt}$ of 2.26 eV and an electric conductivity of $7.0 \times 10^{-1}$ ($\Omega$.cm)$^{-1}$. Moreover, by further adding a suitable amount of argon gas to the reactive gases, the film obtained can have good uniformity and a low resistivity even when it has a reduced thickness.

While the invention has been described in detail and with reference to specific embodiments thereof, it will be apparent to one skilled in the art that various changes and modifications can be made therein without departing from the spirit and scope thereof.

What is claimed is:

1. A method of forming p-type silicon carbide which comprises performing plasma chemical vapor deposition with reactive source gases comprising silane, hydrogen, trimethylboron, and diborane, thereby to attain a band gap from about 1.9 to about 2.26 eV and an electric conductivity of at least about $1 \times 10^{-1}$ S/cm by the action of the carbon contained in the trimethylboron.

2. A method of forming p-type silicon carbide which comprises performing plasma chemical vapor deposition with reactive source gases comprising silane, hydrogen, trimethylboron, and boron trifluoride, thereby to attain a band gap from about 1.9 to about 2.26 eV and an electric conductivity of at least about $1 \times 10^{-1}$ S/cm by the action of the carbon contained in the trimethylboron.

3. A method as claimed in claim 1, wherein the trimethylboron/silane ratio is from 0.003 to 0.006 on a volume basis.

4. A method as claimed in claim 2, wherein the trimethylboron/silane ratio is from 0.003 to 0.006 on a volume basis.

5. A method as claimed in claim 1, wherein the reactive source gases further contain argon gas.

6. A method as claimed in claim 2, wherein the reactive source gases further contain argon gas.

7. A method as claimed in claim 1, wherein the diborane/silane ratio is from 0.003 to 0.015 on a volume basis.

8. A method as claimed in claim 2, wherein the boron trifluoride/silane ratio is from 0.003 to 0.015 on a volume basis.

* * * * *